United States Patent
Nojiri et al.

(10) Patent No.: US 7,547,963 B2
(45) Date of Patent: *Jun. 16, 2009

(54) SEMICONDUCTOR DEVICE AND ITS WIRING METHOD

(75) Inventors: Isao Nojiri, Tokyo (JP); Ryu Makabe, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/902,826

(22) Filed: Sep. 26, 2007

(65) Prior Publication Data

US 2008/0023847 A1 Jan. 31, 2008

Related U.S. Application Data

(63) Continuation of application No. 11/402,944, filed on Apr. 13, 2006, now Pat. No. 7,288,837, which is a continuation of application No. 09/654,875, filed on Sep. 5, 2000, now Pat. No. 7,071,574.

(30) Foreign Application Priority Data

Jan. 17, 2000 (JP) ............................. 2000-007923

(51) Int. Cl.
- H01L 23/02 (2006.01)
- H01L 23/12 (2006.01)
- H01L 23/28 (2006.01)
- H01L 23/52 (2006.01)

(52) U.S. Cl. ................. 257/686; 257/777; 257/E23.085

(58) Field of Classification Search .................. 257/686, 257/777

See application file for complete search history.

(56) References Cited

U.S. PATENT DOCUMENTS

| 5,399,904 A | 3/1995 | Kozono |
| 5,528,083 A | 6/1996 | Malladi et al. |
| 5,606,196 A | 2/1997 | Lee et al. |
| 5,665,996 A | 9/1997 | Williams et al. |

(Continued)

FOREIGN PATENT DOCUMENTS

JP          57-103322          6/1982

(Continued)

OTHER PUBLICATIONS

United States Office Action issued in U.S. Appl. No. 11/902,827 dated Feb. 10, 2009.

*Primary Examiner*—Evan Pert
*Assistant Examiner*—Ben P Sandvik
(74) *Attorney, Agent, or Firm*—McDermott Will & Emery LLP (57) ABSTRACT

A semiconductor device mounted on a mother board has a circuit board to be positioned on the mother board and a semiconductor chip positioned on the circuit board. The circuit board has a connection pad, a relay pad spaced away from the connection pad, and a wire connecting between the connection pad and the relay pad on a surface of the circuit board supporting the semiconductor chip. Also, the semiconductor chip has a connection pad corresponding to the connection pad formed on the circuit board. Further, the connection pad on the circuit board and the connection pad on the semiconductor chip are electrically connected to each other through a bonding wire.

3 Claims, 10 Drawing Sheets

U.S. PATENT DOCUMENTS

| | | |
|---|---|---|
| 5,847,445 A | 12/1998 | Wark |
| 5,898,223 A | 4/1999 | Frye et al. |
| 5,973,403 A | 10/1999 | Wark |
| 6,100,594 A | 8/2000 | Fukui et al. |
| 6,133,637 A | 10/2000 | Hikita et al. |
| 6,159,765 A | 12/2000 | Drehobl et al. |
| 6,252,305 B1 | 6/2001 | Lin et al. |
| 6,271,598 B1 | 8/2001 | Vindasius et al. |
| 6,294,406 B1 | 9/2001 | Bertin et al. |
| 6,740,970 B2 | 5/2004 | Hiraoka et al. |
| 7,071,574 B1 * | 7/2006 | Nojiri et al. ................. 257/784 |
| 7,288,837 B2 * | 10/2007 | Nojiri et al. ................. 257/686 |

FOREIGN PATENT DOCUMENTS

| | | |
|---|---|---|
| JP | 9-186289 | 7/1997 |
| KR | 1997-53214 | 7/1997 |

* cited by examiner

SEMICONDUCTOR DEVICE AND ITS WIRING METHOD

RELATED APPLIATIONS

This application is a Continuation of U.S. application Ser. No. 11/402,944, filed Apr. 13, 2006, now U.S. Pat. No. 7,288,837 which is a Continuation of U.S. application Ser. No. 09/654,875, filed Sep. 5, 2000, now U.S. Pat. No. 7,071,574 claiming priority of Japan Application No. 2000-007923, filed Jan. 17, 2000, the entire contents of each of which are hereby incorporated by reference.

FIELD OF THE INVENTION

The present invention relates to a semiconductor device to be mounted on a mother board and a wiring method for the semiconductor device. In particular, the present invention relates to a semiconductor device such as chipset which includes a circuit board (daughter board) and one or more chips each incorporating one or more semiconductor elements, wherein a connection pad on the chip is electrically connected with another connection pad on the circuit board through a bonding wire, for example. Also, the present invention relates to a method for wiring the semiconductor device or chipset.

BACKGROUND OF THE INVENTION

In order to mount semiconductor devices or components such as chipsets as many as possible on a limited area of a mother board, a variety of stacked-chip package such as S-CSP (Stacked Chip Scale Package) and S-MCP (Multi Chip Package) have been provided in the art. Typically, the package includes a daughter board to be positioned on the mother board and one or stacked plural semiconductor chips mounted on either or both surfaces of the daughter board.

Figure 11:
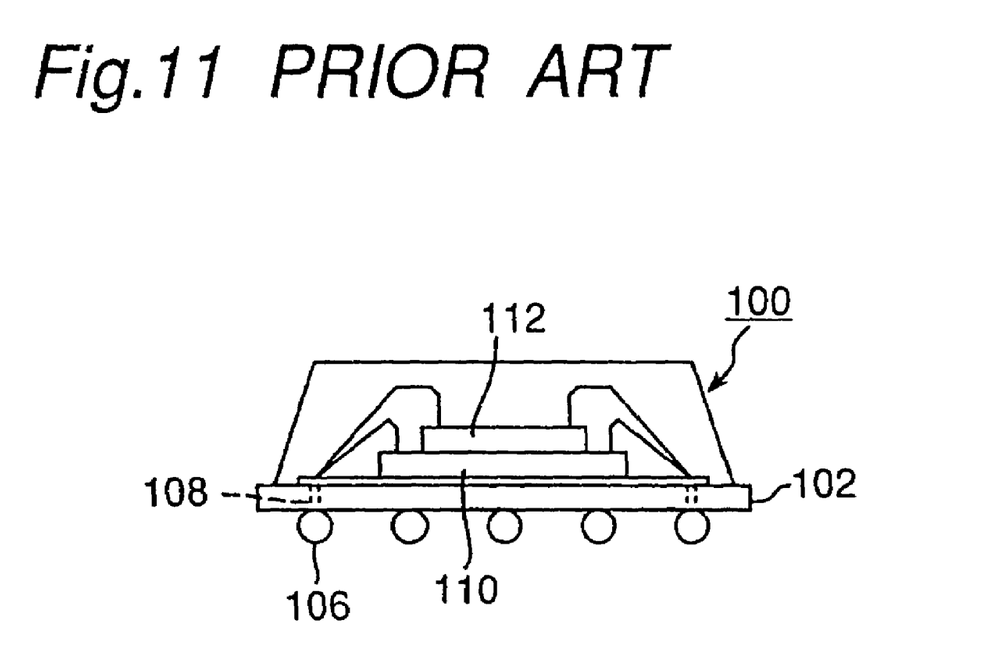
FIG. 11 is a side elevational view of a stacked chip package (S-CSP) of a conventional semiconductor.
Figure 12:
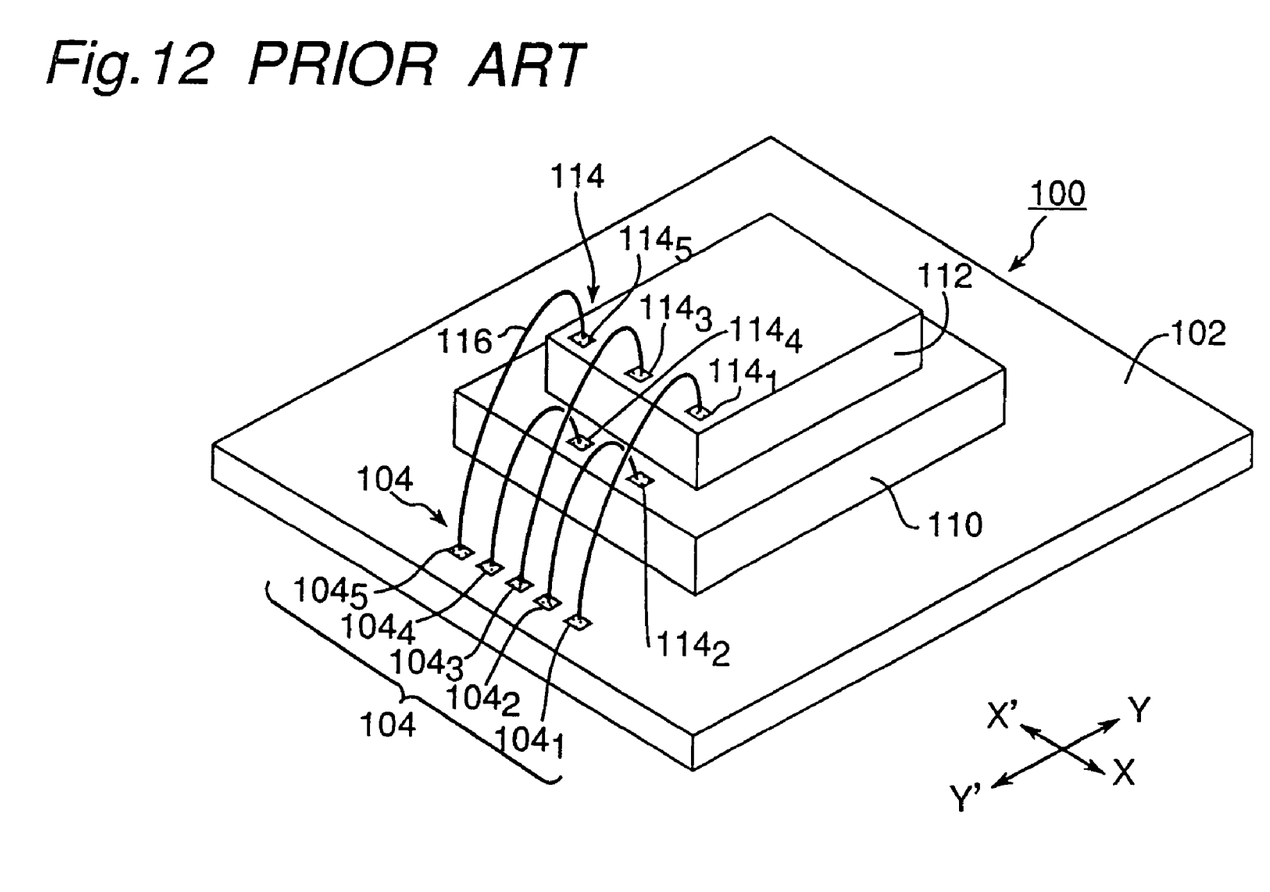
FIG. 12 is a perspective view of the stacked chip package in FIG. 11.

FIGS. 11 and 12 illustrate an example of the conventional stacked package (S-CSP) generally indicated by reference numeral 100. The package 100 includes a daughter board in the form of circuit board 102. The circuit board 102 is wired on its top surface with an electric circuit including a plurality of connection pads or bonding pads 104 ($104_1$-$104_5$) and is provided on its bottom surface with a number of solder balls 106 corresponding to the bonding pads 104, so that each pair of bonding pad 104 and solder ball 106 is electrically connected through a corresponding through-hole 108 formed in the circuit board 102. The circuit board 102 bears first and second semiconductor chips 110 and 112 manufactured through a well-known semiconductor manufacturing process and stacked in this order on the top surface of the circuit board 102. The first semiconductor chip 110 has bonding pads 114 ($114_2$, $114_4$) electrically connected with circuit elements formed in the chip. The second semiconductor chip 112 on the other hand includes another bonding pads 114 ($114_1$, $114_3$, $114_5$) electrically connected with electric elements formed in the chip. The bonding pads of the first and second semiconductor chips 110 and 112 are arranged so that, when viewed from the Y-Y' direction, the bonding pad $114_2$ positions between the bonding pads $114_1$ and $114_3$ and the bonding pad $114_4$ positions between the bonding pads $114_3$ and $114_5$. Also, the bonding pads $114_1$-$114_5$ are electrically connected with the corresponding bonding pads 104 ($104_1$-$104_5$) mounted on the circuit board 102 through respective gold bonding wires. Then, the circuit board 102 with the first and second semiconductor chips 110 and 112 so constructed is sealed by a suitable resin so that the resin covers the chips 110 and 112 and boding wires 116. Thereby, the semiconductor device is completed. It should be noted that the commercially available semiconductor device includes more bonding pads on the circuit board and/or the first and second semiconductor chips; however, only a part of which is illustrated in FIGS. 10 and 11 for the clarification of those drawings.

The above-described semiconductor device 100 in which the semiconductor chips 110 and 112 are electrically connected with the circuit board 102 through bonding pads 104 and 114 mounted thereon and bonding wires 116 extending between corresponding bonding pads requires the bonding pads $114_1$-$114_5$ of the semiconductor chips 110 and 112 and bonding pads $104_1$-$104_5$ of the circuit board 102 to be arranged in this order in the X-X' direction, respectively. Specifically, as shown in FIG. 12, the five bonding pads $104_1$-$104_5$ aligned in the X-X' direction on the circuit board 102 should be related with the bonding pads $114_1$-$114_5$ on the semiconductor chips 110 and 112. This is because that, when assuming that the bonding pad $104_5$ on the circuit board 102 is connected with another bonding pad $114_1$ on the semiconductor chip 112, positioned on the opposite side with respect to the X-X' direction, through the bonding wire 116, the bonding wire would cross and then make short circuits with another bonding wires.

However, in order to make an electrical connection between the circuit on the mother board and the electric component positioned on the mother board, a practical requirement still exists in which, for example, the bonding pad $114_1$ on the semiconductor chip 112 is connected with the bonding pad $104_5$ on the circuit board 102. This can be attained by changing the circuit pattern in the semiconductor chips 110 and 12 according to the circuit patterns of the mother boards, which disadvantageously requires a variety of exposure masks for the circuits of the chips.

SUMMARY OF THE INVENTION

Therefore, an object of the present invention is to provide a semiconductor device and its wiring method which allow the connection pads on the semiconductor chips to be connected with corresponding electrical connecting portions on the circuit board or daughter board, which would not subject to the restrictions imposed by the wire bonding.

Another object of the present invention is to provide a semiconductor device capable of being mounted on a variety of mother boards without any need to change the circuit pattern of the semiconductor chips Another object of the present invention is to provide a semiconductor device which allows the circuit board to be electrically connected with the semiconductor chips mounted on the board beyond a range in which the wire bonding can apply.

Accordingly, a semiconductor device mounted on a mother board comprises a circuit board to be positioned on the mother board, and a semiconductor chip positioned on the circuit board. The circuit board has a connection pad, a relay pad spaced away from the connection pad, and a wire connecting between the connection pad and the relay pad on a surface of the circuit board supporting the semiconductor chip. Also, the semiconductor chip has a connection pad corresponding to the connection pad formed on the circuit board. Further, the connection pad on the circuit board and the connection pad on the semiconductor chip are electrically connected through a bonding wire.

The wire connecting between the connection pad and the relay pad on the circuit board may be printed on the circuit board with the connection pad and the relay pad.

Also, the wire connecting between the connection pad and the relay pad on the circuit board may be a bonding wire.

Another semiconductor device comprises a first semiconductor chip having a connection pad, a second semiconductor chip positioned on the first semiconductor chip, the second semiconductor chip having a connection pad, wherein the electrode on the second semiconductor chip is electrically connected with the connection pad on the first semiconductor chip.

The connection pad on the first semiconductor chip may be connected with the connection pad on the second semiconductor chip through a bonding wire.

Also, the connection pad on the first semiconductor chip positions in a region where the first semiconductor faces to the second semiconductor chip, the connection pad on the second semiconductor chip in the region, and the connection pad on the first semiconductor chip is electrically connected with the connection pad on the second semiconductor chip through a conductive member positioned in the region.

Another wiring method comprises the steps of:

providing a first semiconductor chip having a connection pad;

positioning a second semiconductor chip on the first semiconductor chip, the second semiconductor chip having a connection pad; and electrically connecting between the connection pad of the first semiconductor chip and the connection pad of the second semiconductor chip.

The connection pad of the first semiconductor chip may be electrically connected with the connection pad of the second electrode through a bonding wire.

Also, the connection pad on the first semiconductor chip positions in a region where the first semiconductor faces to the second semiconductor chip and the connection pad on the second semiconductor chip positions in the region, and the connection pad on the first semiconductor chip is electrically connected with the connection pad on the second semiconductor chip through a conductive member positioned in the region.

DETAILED DESCRIPTION OF THE PREFERRED EMBODIMENTS

With reference to the drawings, descriptions will be made to various preferred embodiments of the present invention. Note that in the following discussions like reference numerals designate like parts or portions throughout the drawings.

Embodiment 1

Figure 1:
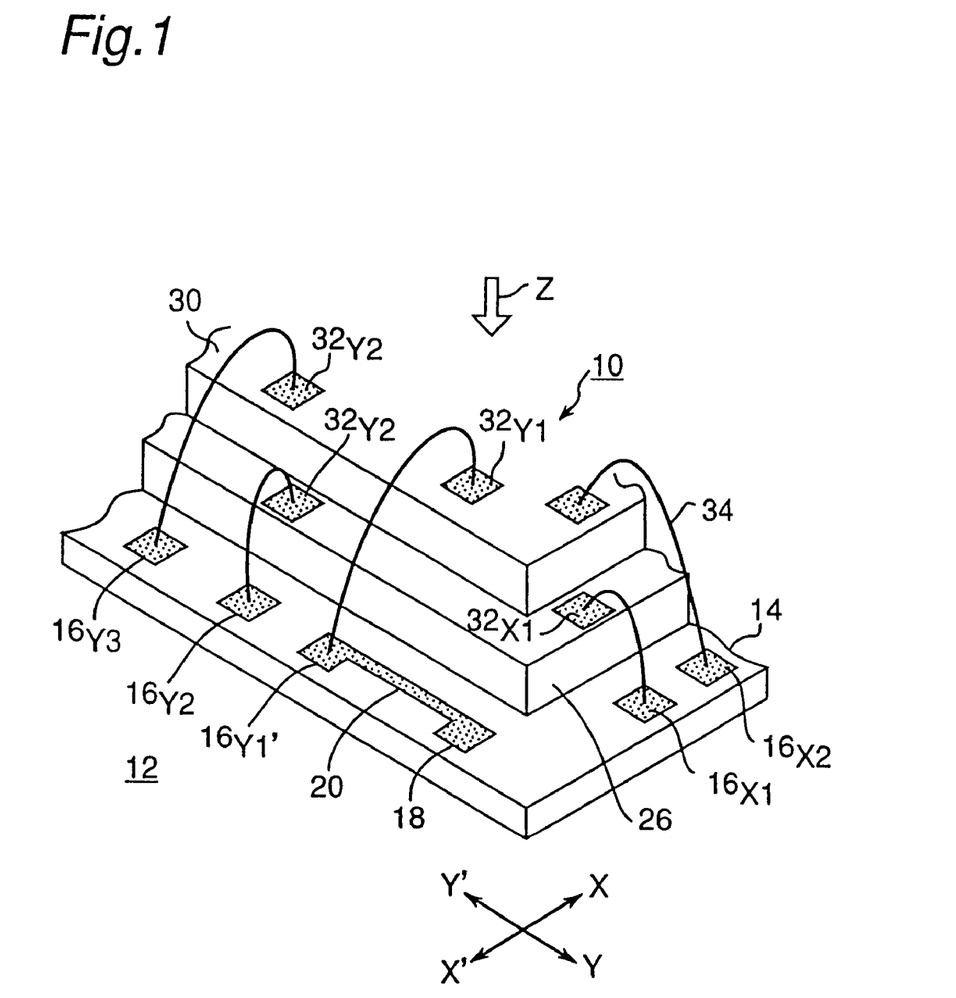
FIG. 1 is a partial perspective view of a semiconductor device according to the first embodiment of the present invention.
Figure 2:
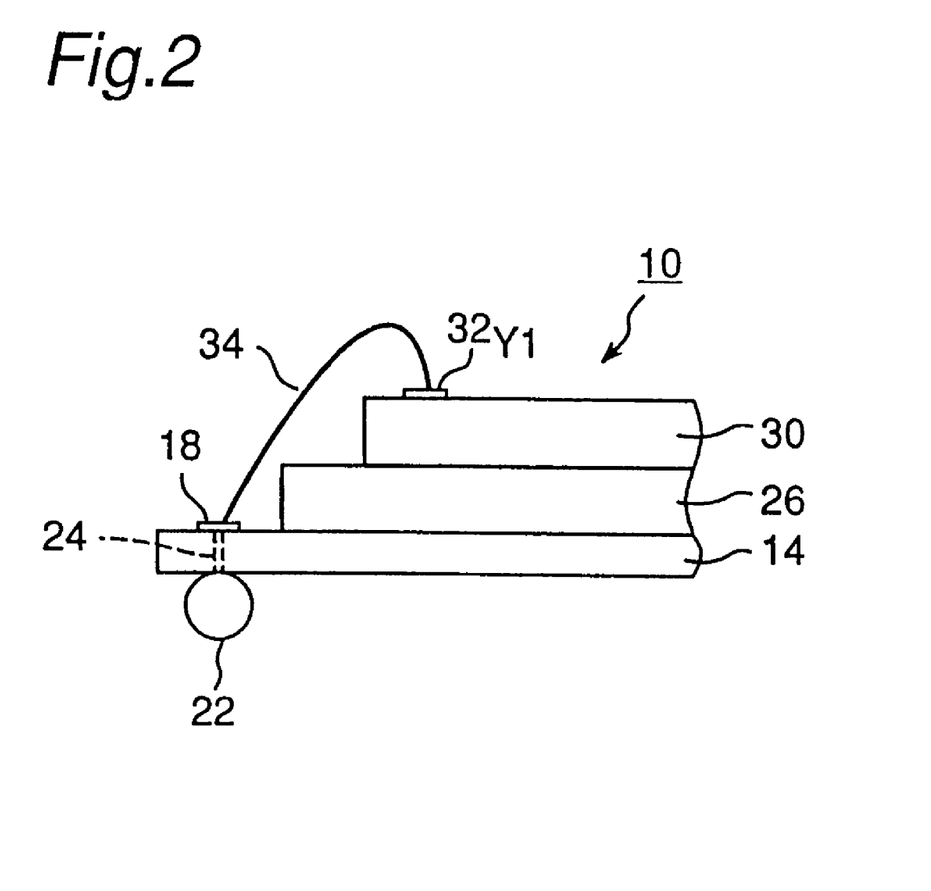
FIG. 2 is side elevational view of the semiconductor device in FIG. 1.

FIGS. 1 and 2 illustrate respective parts of a semiconductor device of the first embodiment. The semiconductor device, generally indicated by reference numeral 10, is a semiconductor electric component such as arithmetic and memory devices to be mounted on a substrate or mother board 12 together with similar semiconductor devices and other electric components. The semiconductor device 10 includes a circuit board 14. Typically, the circuit board 14 employs a rectangular board (daughter board) bearing certain circuits printed on its opposite surfaces. Also, the board is made of suitable insulator such as polyimide or the mixture of glass and epoxy resin.

The circuit printed on the top surface of the circuit board 14 has a plurality of connection pad or bonding pads $16_{X1}$, $16_{X2}$, ..., $16_{Y1}'$, $16_{Y2}$, $16_{Y3}$, ... along and beside one edge of the circuit board, extending in the X-X' and Y-Y' directions perpendicular to each other. Also, the board 14 bears a connection pad 18 spaced a certain distance away from the pad $16_{Y1}'$ (referred to as "relay pad" as necessary) in the Y-Y' direction and a connecting wire 20 printed on the board for the electrical connection between the relay pad $16_{Y1}'$ and the connection pad 18. As shown in FIG. 2, the bottom surface of the circuit board 14 holds a plurality of solder balls 22 for the corresponding bonding pads $16_{X1}$, $16_{X2}$, ..., $16_{Y2}$, $16_{Y3}$, ... and connection pad 18 except for the relay pad $16_{X1}'$. Also, the solder balls 22 are electrically connected with the corresponding bonding pads $16_{X1}$, $16_{X2}$, ..., $16_{Y2}$, $16_{Y3}$, ... and connection pad 18 through, for example, respective through-holes 24 (see FIG. 2) extending between the top and bottom surfaces of the circuit board 14.

The circuit board 14 supports the first semiconductor chip 26 on its top surface. The first semiconductor chip 26 is designed to be smaller than the circuit board 14 so that a marginal portion of the circuit board 14 supporting the electrodes exposes to air around the semiconductor chip 26 as shown in FIG. 1. The first semiconductor chip 26 in turn supports the second semiconductor chip 30 on its top surface. The second semiconductor chip 30 is designed to be smaller than the first semiconductor chip 26 so that a marginal portion of the first semiconductor chip 26 exposes to air around the second semiconductor chip 30. The first and second semiconductor chips 26 and 30 may be secured on the circuit board 14 and the first semiconductor chip 26, respectively, by means of a suitable bonding material. Although not only the circuit board 14 but also the first and second semiconductor chips 26 and 30 have rectangular plane configurations, they may have another plane configurations.

The first and second semiconductor chips 26 and 30 each have one or more semiconductor elements such as transistor formed through the semiconductor manufacturing process including several steps such as film formation, etching, and exposure. In particular, the first semiconductor chip 26 bears connection pads or bonding pads $32_{X1}$, $32_{Y2}$, . . . along edges extending in the X-X' and Y-Y' directions. Likewise, the second semiconductor chip 30 bears bonding pads $32_{X2}$, $32_{Y1}$, $32_{Y2}$, . . . along edges extending in the X-X' and Y-Y' directions. The bonding pads $32_{X1}$, $32_{X2}$, . . . , $32_{Y1}$, $32_{Y2}$, $32_{Y3}$, . . . are located corresponding to the bonding pads $16_{X1}$, $16_{X2}$, . . . , $16_{Y1}'$, $16_{Y2}$, $16_{Y3}$, . . . on the circuit board 14. Specifically, for the bonding pads arranged along and beside the edges extending in the Y-Y' direction, the corresponding bonding pads $16_{Y1}'$ and $32_{Y1}$, $16_{Y2}$ and $32_{Y2}$, and $16_{Y3}$ and $32_{Y3}$ are positioned on respective lines extending in the X-X' direction. Likewise, for the bonding pads arranged along and beside the edges extending in the X-X' direction, the corresponding bonding pads $16_{X1}$ and $32_{C1}$, $16_{X2}$ and $32_{X2}$, and $16_{X3}$ and $32_{X3}$ are positioned on respective lines extending in the Y-Y' direction.

It should be noted that the bonding pads $32_{X1}$, $32_{X2}$, . . . , $32_{Y1}$, $32_{Y2}$, $32_{Y3}$, . . . may be formed in the process of the semiconductor manufacturing process or may be formed in another process by the use of a well known printing technique, for example. Also, after the first and second semiconductor chips 26 and 30 has been secured on the circuit board 14, the bonding pads $32_{X1}$, $32_{X2}$, . . . , $32_{Y1}$, $32_{Y2}$, $32_{Y3}$, . . . are electrically connected with corresponding bonding pads $16_{X1}$, $16_{X2}$, . . . , $16_{Y1}'$, $16_{Y2}$, $16_{Y3}$, . . . by extending the bonding wires of gold therebetween. Finally, although not shown, the semiconductor chips 26 and 30, including bonding wires 34 and bonding pads, are covered with a suitable sealant made of insulator.

The semiconductor device 10 so constructed is positioned on the mother board 12 which is generally far greater than the circuit board 14 and then heated in a suitable furnace (not shown) such as reflow furnace for melting the solder balls. This causes the semiconductor chips 26 and 30 to be secured and connected permanently with the circuit of the mother board. Therefore, even though the bonding pad $32_{X1}$ is offset from the bonding pad $32_{Y1}$ in the Y-Y' direction when the semiconductor chips 26 and 30 have been mounted on the circuit board 14, it is electrically connected with the associated portion of the circuit board 14 or connection pad 18 through the bonding pad or relay pad $16_{Y1}'$. This means that, simply by using the relay pad on the circuit board 14 and without changing the circuit design (i.e., mask pattern) of the semiconductor chip 30, the bonding pads of the semiconductor chips 26 and 30 are suitably connected with the corresponding circuit portions on the mother board. Accordingly, with the semiconductor device 10, no physical contacts or interference with another bonding wires which has been described above will be formed.

Second Embodiment

Figure 3:
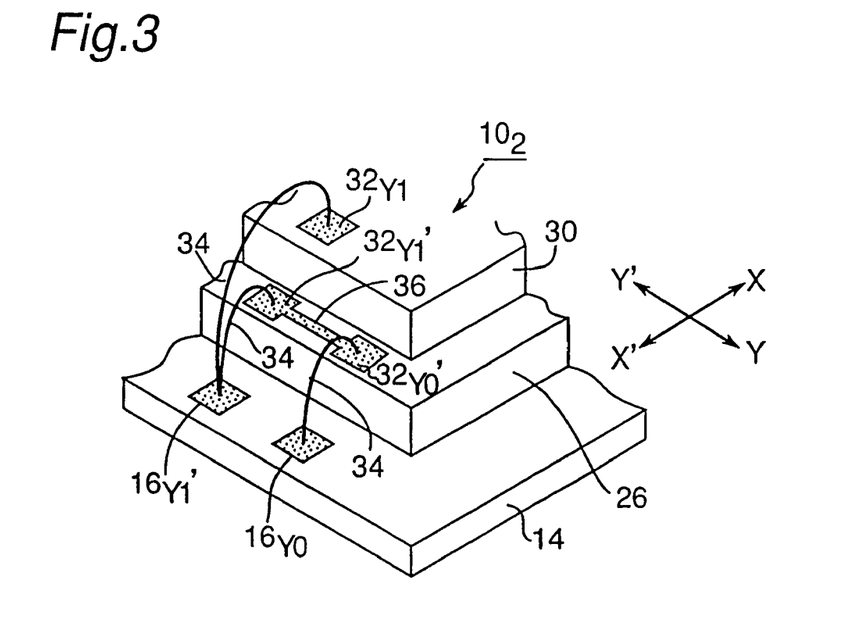
FIG. 3 is a partial perspective view of a semiconductor device according to the second embodiment of the present invention.

FIG. 3 illustrates a part of the semiconductor device, generally indicated by reference numeral $10_2$, according to the second embodiment of the present invention. In the semiconductor device $10_2$, the circuit formed on the circuit board 14 includes a connecting bonding pad $16_{Y0}$ spaced a certain distance away from the relay pad $16_{Y1}'$ in the Y-Y' direction. The first semiconductor chip 26 bears relay pads $32_{Y1}'$ and $32_{Y0}'$ spaced away from each other in the Y-Y' direction and a connecting wire 36 extending between the relay pads $32_{Y1}'$ and $32_{Y0}'$ for the electrical connection of the electrodes. The circuit board 14 supports a solder ball (not shown) on the bottom surface of the board so that the solder ball opposes the bonding pad $16_{Y0}$. The solder ball and the opposing bonding pad $16_{Y0}$ are electrically connected through a through-hole (not shown). Bonding wires 34 are extended between the connecting bonding pad $16_{Y0}$ and the relay pad $32_{Y0}'$, relay pads $32_{Y1}'$ and $16_{Y1}'$, and the relay pad $16Y_1'$ and the bonding pad $32_{Y1}$ of the second semiconductor chip 30. This causes an electrical connection between the bonding pad $32_{Y1}$ and the connecting bonding pad $16_{Y0}$ shifted from the bonding pad $32_{Y1}$ in the Y-Y' direction.

With the semiconductor device $10_2$, similar to the first embodiment, the bonding pads of the semiconductor chips 26 and 30 can properly be connected with the corresponding circuit portions on the mother board by providing minor changes to the mask patterns of the semiconductor chip 26 and the circuit board without providing any design change to the circuit or relay pads on the circuit board 14. Also, even where no space remains for the wire 20 on the circuit board 14 as shown in FIG. 1, the physical contact or interference of the bonding wires will be eliminated by the transit wire on the semiconductor chip.

Third Embodiment

Figure 4:
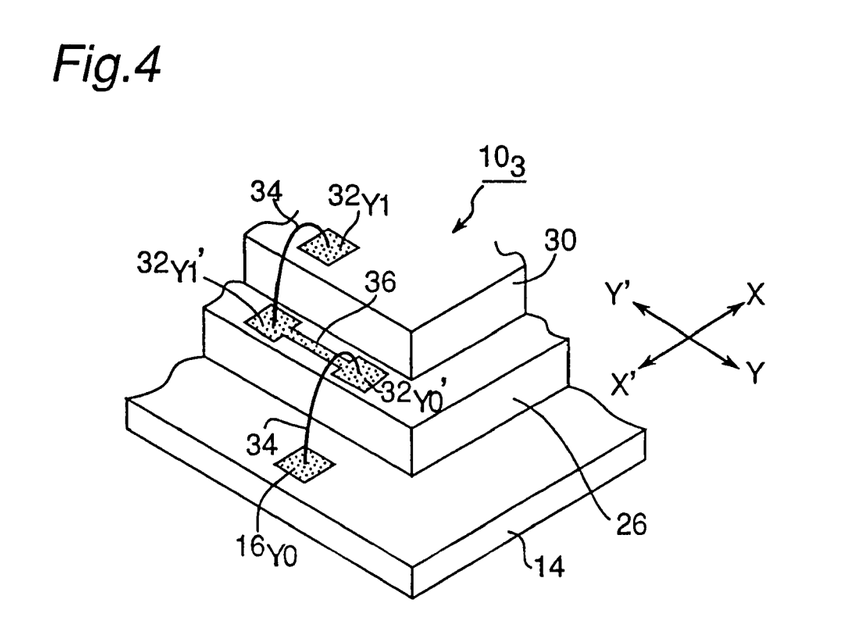
FIG. 4 is a partial perspective view of a semiconductor device according to the third embodiment of the present invention.

FIG. 4 illustrates a part of the semiconductor device, generally indicated by reference numeral $10_3$, according to the third embodiment of the present invention, which is a modification of the second embodiment. In this embodiment, the bonding wire 34 is extended between the bonding pad $32_{Y1}$ of the semiconductor chip 30 and the relay pad $32_{Y1}'$ of the semiconductor chip 26 and between the relay pad $32_{Y0}'$ and the connecting bonding pad $16_{Y0}$ of the circuit board 14, so that the bonding pad $32_{Y1}$ is electrically connected with the bonding pad $16_{Y0}$ which is shifted from the bonding pad $32_{Y1}$ in the Y-Y' direction without any possibility of the interference of the bonding wires. Also, this embodiment only requires the relay pad or bonding pads on the second semiconductor chip 26. Further, no change is needed for the mask pattern of the circuit board 14 or the second semiconductor chip 30. Furthermore, no bonding wire is required between the relay pads $16_{Y1}'$ and $32_{Y1}'$, which renders the wire bonding more simple and then inexpensive than that in the second embodiment. Besides, the total length of the bonding wire can be reduced. This in turn reduces an electric resistance in the circuit which would otherwise cause a signal delay to increase the rise and fall times of signals.

Fifth Embodiment

Figure 5:
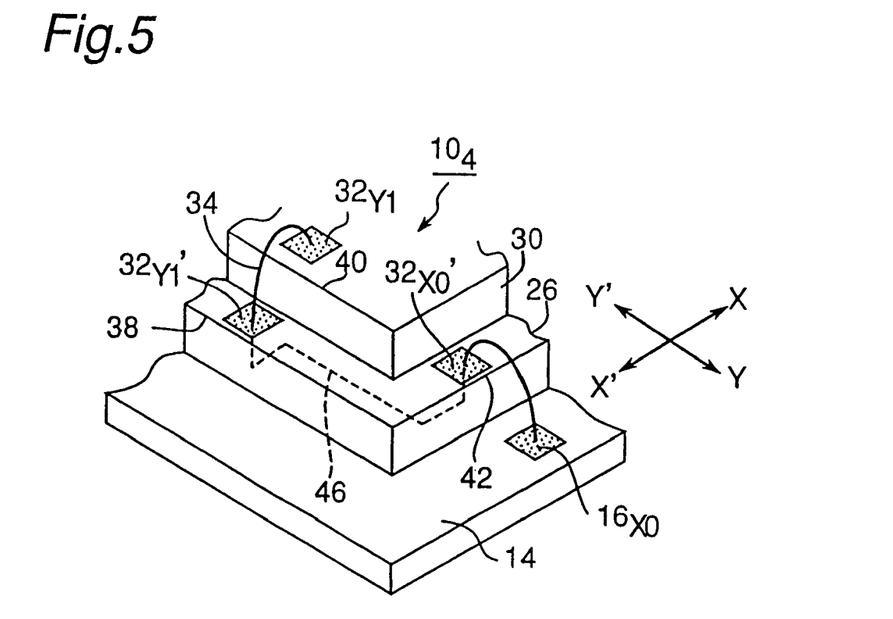
FIG. 5 is a partial perspective view of a semiconductor device according to the fourth embodiment of the present invention.

FIG. 5 illustrates a part of the semiconductor device, generally indicated by reference numeral $10_4$, according to the fifth embodiment of the present invention. In the semiconductor device $10_4$, one bonding pad mounted on the semiconductor chip 30 beside its edge extending in the Y-Y' direction is electrically connected with another bonding pad mounted on the circuit board 14 beside its edge extending in the X-X' direction.

Specifically, a relay pad $32_{Y1}'$ is formed on a portion of the top surface of the semiconductor chip 26, beside its edge 38 extending in the Y-Y' direction, corresponding to the bonding pad $32_{Y1}$ formed on the top surface of the semiconductor chip 30, beside its edge 40 extending in the same direction. Also, a relay pad $32_{X0}'$ is formed on the top surface of the semiconductor chip 26, beside its edge 42 extending in the X-X' direction, corresponding to the bonding pad $16_{X0}$ formed on the circuit board 14, beside its edge 44 extending in the same direction. The relay pads $32_{Y1}'$ and $32_{X0}'$ are electrically connected with each other through a connecting wire or line 46 formed therein or thereon in the manufacturing process of the semiconductor chip 26. The circuit board 14 has a solder ball (not shown) secured on its bottom surface and electrically connected with the bonding pad $16_{X0}$ by a through-hole (not shown). The bonding wires 34 are extended between the bonding pad $32_{Y1}$ and the relay pad $32_{Y1}'$ and between the relay pad $32_{X0}'$ and the connection pad $16_{X0}$, which causes the bonding pad $32_{Y1}$ to be electrically connected with the bonding pad $16_{X0}$ which is shifted both in the X-X' and Y-Y' directions.

With the semiconductor device $10_4$, each pad can electrically be connected with another pad which is shifted in the X-X' and Y-Y' directions beyond a range in which a wire bonding can be applied. Therefore, each connecting portion of the semiconductor device can be connected around to any portions of the mother board.

Although in this embodiment the connection pad positioned beside one edge of the semiconductor chip is connected with another connection pad positioned beside another neighboring edge of the circuit board, it may be connected with another connection pad positioned on the opposite side of the board since the circuit can be wired freely in the circuit board in the manufacturing process of the semiconductor device.

Fifth Embodiment

Figure 6:
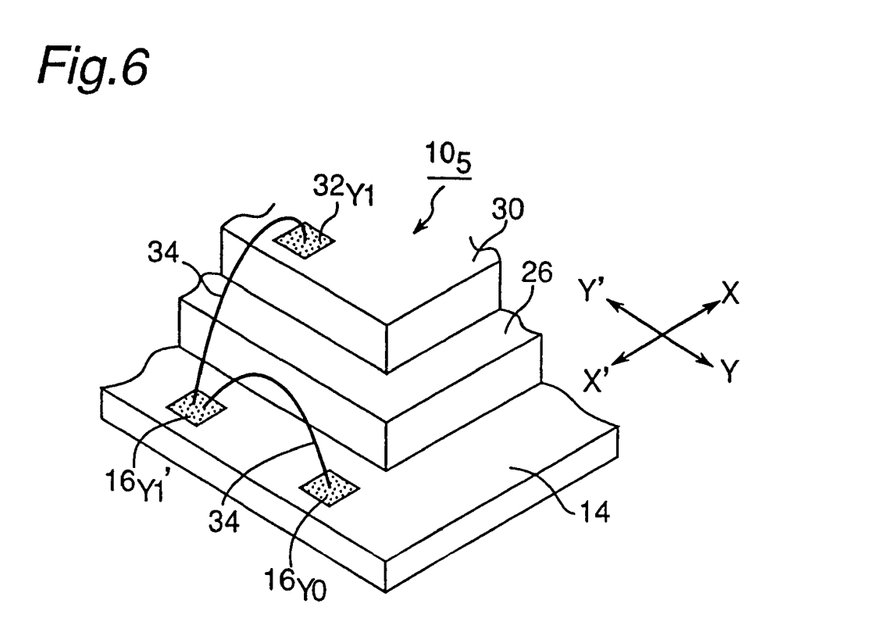
FIG. 6 is a partial perspective view of a semiconductor device according to the fifth embodiment of the present invention.

FIG. 6 illustrates a part of the semiconductor device, generally indicated by reference numeral $10_5$, according to the fifth embodiment of the present invention, which is a modification of the first embodiment. In the semiconductor device $10_5$, the relay pad $16_{Y1}'$ formed on the circuit board 14 is electrically connected with the connecting bonding pad $16_{Y0}$ through the bonding wire 34. With the semiconductor device $10_5$, similar to the first embodiment, the bonding pad $32_{Y1}$ can be connected with another bonding pad on the circuit board which is shifted from the bonding pad $32_{Y1}$ not only in the Y-Y' direction but also, by using another relay pad, in the X-X' direction.

Sixth Embodiment

Figure 7:
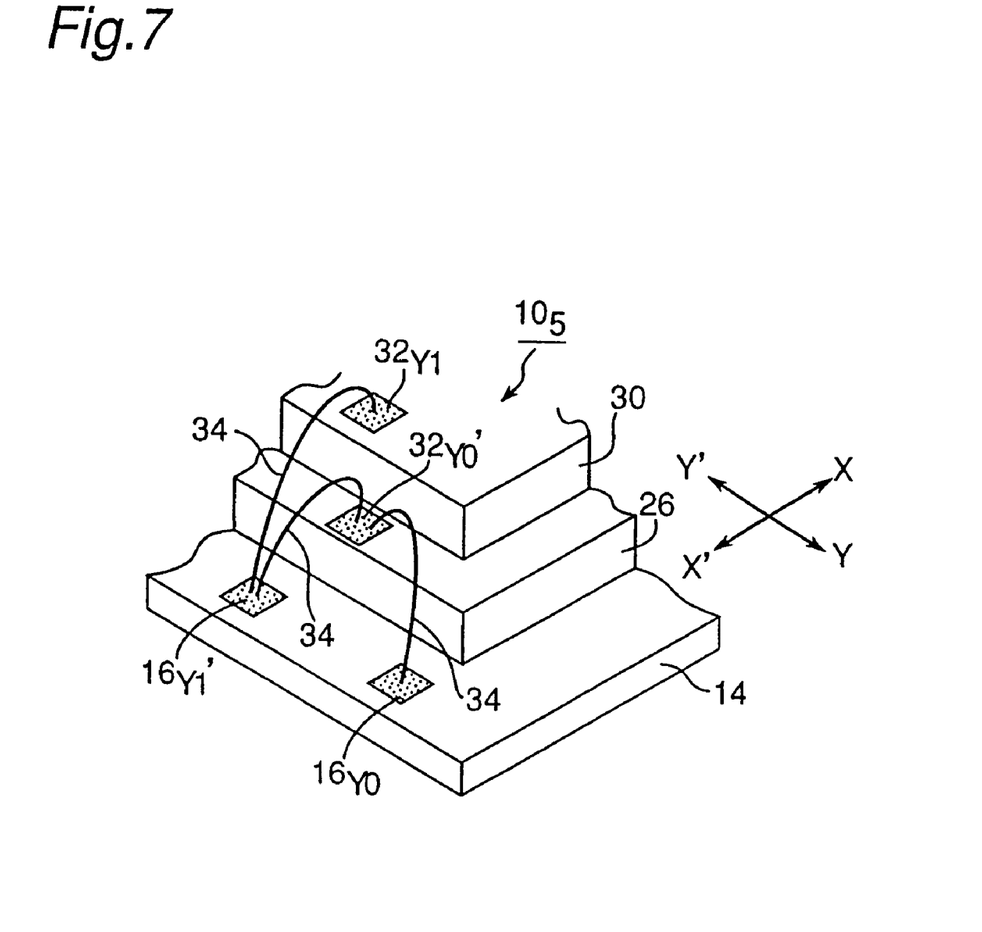
FIG. 7 is a partial perspective view of a semiconductor device according to the sixth embodiment of the present invention.

FIG. 7 illustrates a part of the semiconductor device, generally indicated by reference numeral $10_6$, according to the sixth embodiment of the present invention, which is a modification of the second embodiment. In the semiconductor device 106, a relay pad $32_{Y0}'$ is formed on the semiconductor chip 26. Also, the bonding wires 34 are extended between the bonding pad $32_{Y1}$ of the semiconductor chip 30 and the relay pad $16_{Y1}'$ of the circuit board 14, between the relay pad $16_{Y1}'$ on the circuit board 14 and the relay pad $32_{Y0}'$ on the semiconductor chip 26, and between the relay pad $32_{Y0}'$ of the semiconductor chip 26 and the connecting bonding pad $16_{Y0}$ on the circuit board 14. This causes the bonding pad $32_{Y1}$ on the semiconductor chip 30 to be connected with another bonding pad $16_{Y0}$ on the circuit board which is shifted from the bonding pad $32_{Y1}$ in the Y-Y' direction.

With the semiconductor device $10_6$, the bonding pad $32_{Y1}$ on the semiconductor chip 30 can be connected with another bonding pad on the circuit board 14 which is shifted spaced away from the bonding pad $32_{Y1}$ without any need to change the mask pattern of the semiconductor chip 30 and also without any interference of the bonding wires.

Seventh Embodiment

Figure 8:
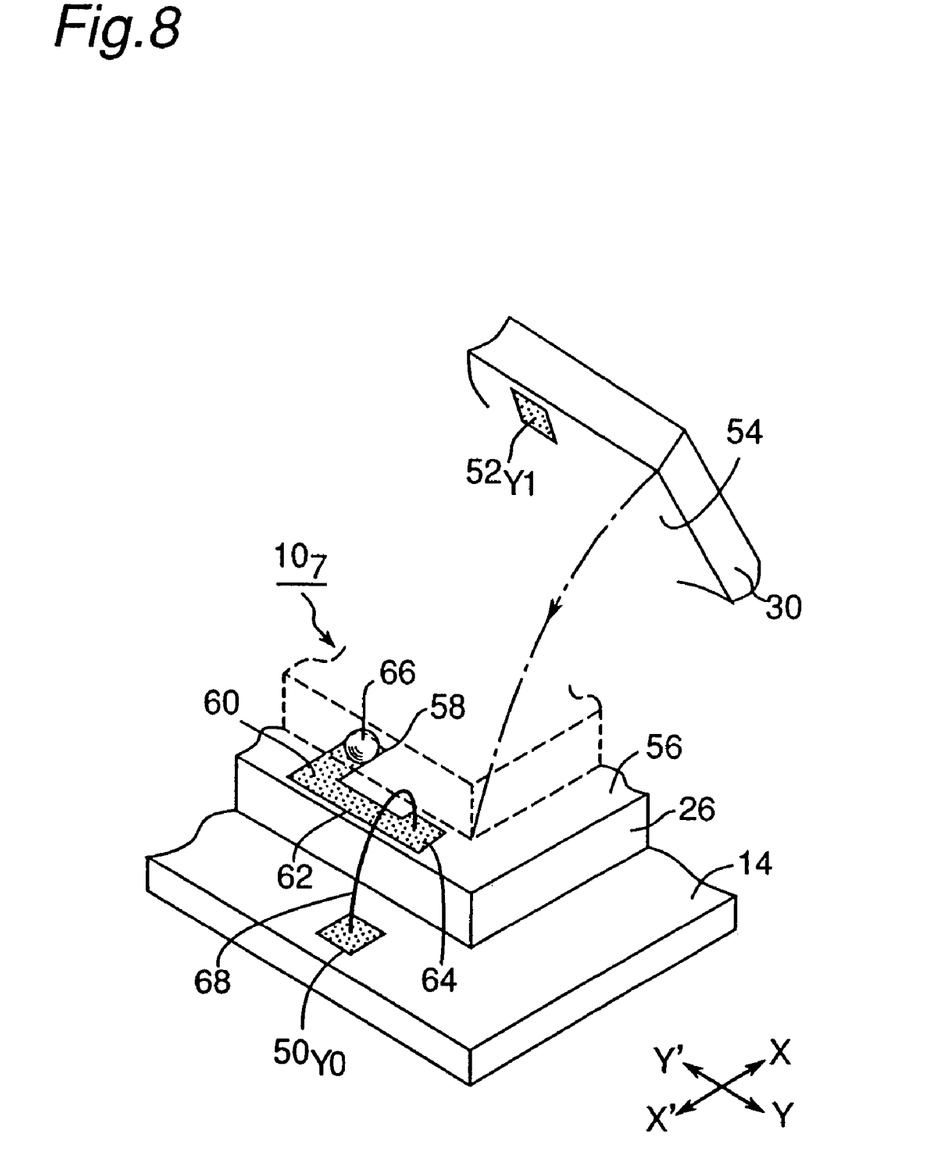
FIG. 8 is a partial perspective view of a semiconductor device according to the seventh embodiment of the present invention.

FIG. 8 illustrates a part of the semiconductor device, generally indicated by reference numeral $10_7$, according to the seventh embodiment of the present invention. In this semiconductor device $10_7$, a connection pad $52_{Y1}$ of the semiconductor chip 30, which would be connected to a connection pad $50_{Y0}$ on the top surface of the circuit board, is formed on the bottom surface of the semiconductor chip 30. Also, a top surface 56 of the semiconductor chip 26 supporting the semiconductor chip 30 has a wire portion 58 formed on the surface 56 so that, when the semiconductor chip 30 is placed on the semiconductor chip 26, the connection pad $52_{Y1}$ faces to the wire portion 58. The wire portion 58 is extended outwardly in the X-X' direction and then connected with another wire portion 60 formed in a marginal region surrounding around a region where the semiconductor chip 30 would occupy. The wire portion 60 is in turn connected through another wire portion 62 extending from the wire portion 60 in the X direction with a relay pad 64 also formed on the marginal region. The connection pad $52_{Y1}$ on the semiconductor chip 30 is connected with the wire portion 58 by placing the semiconductor chip 30 onto the semiconductor chip 26 and, at that moment, by holding a solder 66 between the connection pad $42_{Y1}$ and the wire portion 58. The solder 66 is heated to melt in a subsequent process, which causes the semiconductor chip 30 to make a close contact with the semiconductor chip 26. Then, the wire portion 64 of the semiconductor chip 26 is electrically connected with the connection pad $50_{Y0}$ of the circuit board 14 through the bonding wire 34.

With the semiconductor device $10_7$, the connection pad on the semiconductor chip, even though it is formed on the surface confronting to the opposed semiconductor chip, can be wired to any connecting portion on the circuit board which is shifted from the connection pad in the X-X' and Y-Y' directions without causing the interference of the bonding wires. Also, even when the upper semiconductor chip 30 covers most of the opposing upper surface of the lower semiconductor chip 26, the wire can be extended in the X-X' and/or Y-Y' direction within the limited marginal region in the top surface of the lower semiconductor. Further, the length of the bonding wire can be reduced, which in turn reduces time and cost for the wire bonding.

Although FIG. 8 shows one connection pad on the bottom surface of the semiconductor chip 30, more connection pad or all the pat electrode may be arranged on the bottom surface of the semiconductor chip 30. In the latter instance, no connection pad exists on the top surface of the semiconductor chip 30. This allows the connection pads to be connected with another connecting portions without using wire bonding and, thereby, reduces a height and then the size of the semiconductor device.

Of course, only a part of the number of electrodes, including the connection pad $52_{Y1}$, may be formed on the bottom surface of the semiconductor chip with the remaining part of the connection pads positioned on the top surface of the semiconductor chip.

Also, although the solder is used for the connection of the opposing electrodes on the semiconductor chips 26 and 30, it may be replaced by another connecting technique.

Eighth Embodiment

Figure 9:
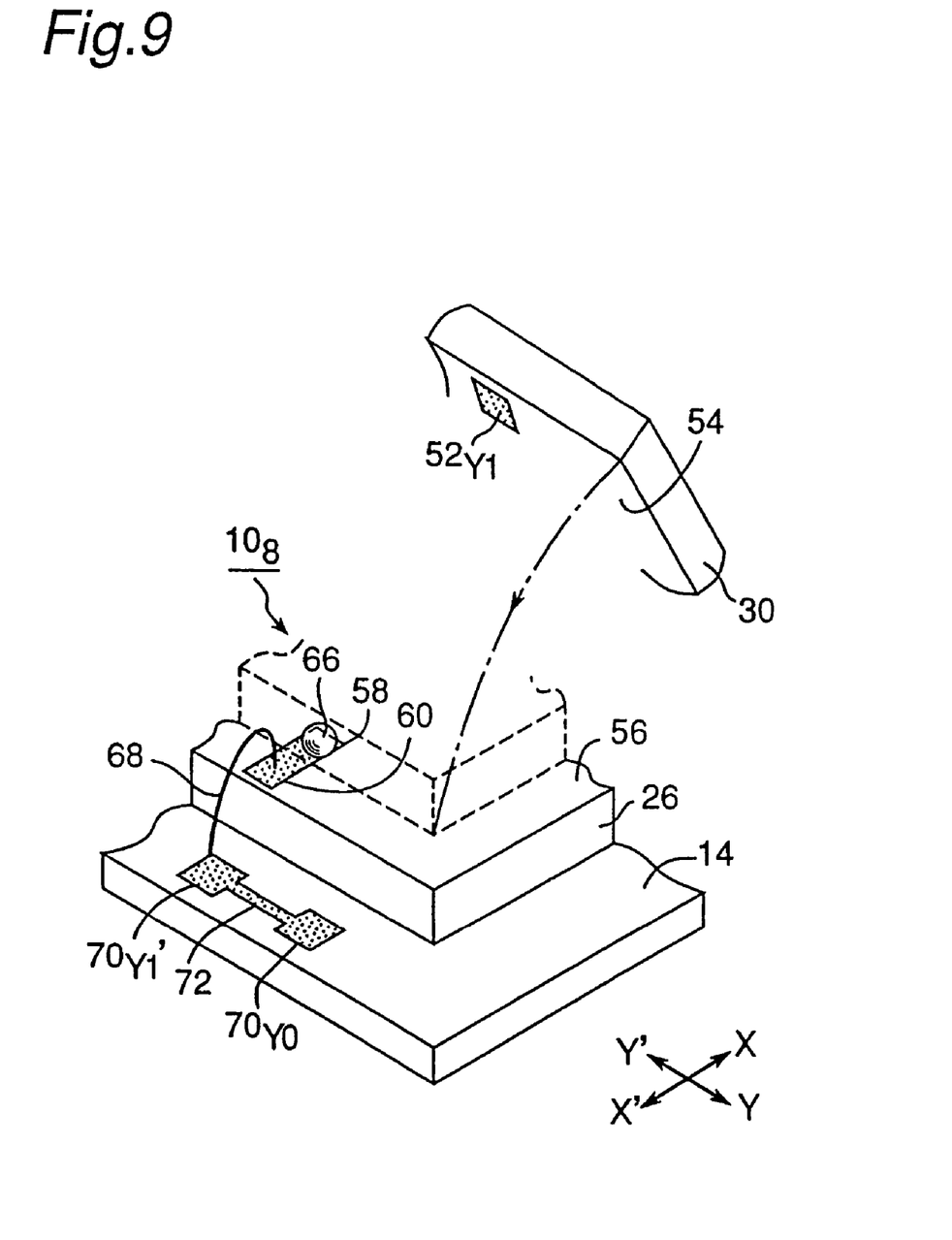
FIG. 9 is a partial perspective view of a semiconductor device according to the eighth embodiment of the present invention.

FIG. 9 illustrates a part of the semiconductor device, generally indicated by reference numeral $10_8$, according to the eighth embodiment of the present invention, which is a modification of the seventh embodiment and is removed of wire portions 62 and 64 in the seventh embodiment shown in FIG. 8. Also, the circuit board 14 has connection pads 70$_{Y0}$ and 70$_{Y1}$' formed thereon and spaced apart in the Y-Y' direction and a connection pad 72 connecting between the connection pads 70$_{Y0}$ and 70$_{Y1}$'. Further, the wire portion 60 and the connection pad 70$_{Y1}$' are electrically connected to each other by the bonding wire 68. With the semiconductor device 10$_8$, the same advantages can be attained as the seventh embodiment.

Ninth Embodiment

Figure 10:
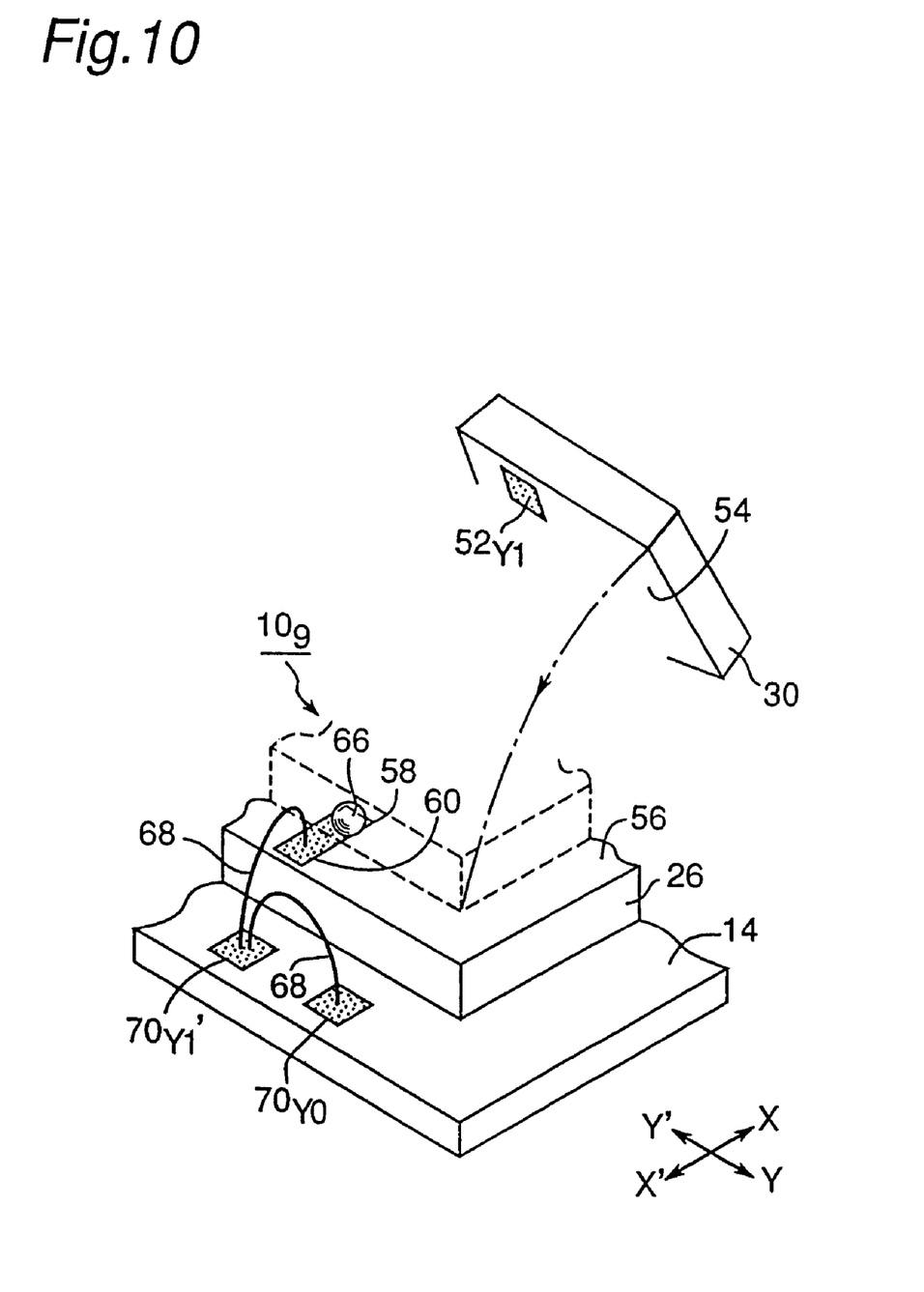
FIG. 10 is a partial perspective view of a semiconductor device according to the ninth embodiment of the present invention.

FIG. 10 illustrates a part of the semiconductor device, generally indicated by reference numeral 10$_9$, according to the ninth embodiment of the present invention, which is a modification of the eighth embodiment. In this semiconductor device 109, the connection pad 70$_{Y0}$ and the relay pad 70$_{Y1}$' are electrically connected by the bonding wire 34. With the semiconductor device 10$_9$, the same advantages can be attained as the seventh embodiment.

Other Modifications

Although in the previous embodiments the circuit board is made of rectangular plate, it may be a lead frame which is made of conductive plate and then formed into a certain configuration.

Also, although in the previous embodiments the circuit board supports the first and second semiconductor chips, the present invention is not limited by the number of the semiconductor chips mounted on the circuit board.

ADVANTAGES OF THE INVENTION

As can be seen from above, according to the present invention the connection pads of the semiconductor chip can be connected with any connecting portions provided on the substrate without any restriction imposed by the wire bonding and beyond the wiring capability of the wire bonding.

Also, the semiconductor device according to the present invention can be mounted on a variety of mother boards without any need to change its circuit.

Further, the semiconductor device according to the present invention allows the semiconductor chip to be connected with the circuit board beyond the range in which the wire bonding can apply.

What is claimed is:

1. A semiconductor device, comprising:
   a circuit board having a first pad;
   a first semiconductor chip mounted on said circuit board and having a second pad, a third pads and a connection wire electrically connecting the second and third pads;
   a second semiconductor chip mounted on said first semiconductor chip and having a fourth pad,
   a first connection member connecting the first pad and the second pad,
   a second connection member connecting the third pad and fourth pad, wherein the connection wire is formed in said first semiconductor chip, and
   the second pad is formed on a top surface of said first semiconductor chip and beside one edge of said first semiconductor chip while the third pad is formed on the top surface of said first semiconductor chip and beside another edge of said first semiconductor chip.

2. The semiconductor device according to claim 1, wherein said first connection ember is a bonding wire jumping from the second pad over one edge of said first semiconductor chip and reaching the first pad, and
   said second connection member is a bonding wire jumping from the fourth pad over one edge of the second semiconductor chip and reaching the third pad.

3. The semiconductor device according to claim 1, wherein the connection wire is embedded in the first semiconductor chip.

* * * * *